(12) United States Patent
Nishimura

(10) Patent No.: US 9,339,893 B2
(45) Date of Patent: May 17, 2016

(54) LEAD-FREE SOLDER ALLOY

(75) Inventor: Tetsuro Nishimura, Osaka (JP)

(73) Assignee: Nihon Superior Co., Ltd., Osaka (JP)

( * ) Notice: Subject to any disclaimer, the term of this patent is extended or adjusted under 35 U.S.C. 154(b) by 0 days.

(21) Appl. No.: 14/111,898

(22) PCT Filed: Apr. 16, 2012

(86) PCT No.: PCT/JP2012/060299
§ 371 (c)(1),
(2), (4) Date: Oct. 15, 2013

(87) PCT Pub. No.: WO2012/141331
PCT Pub. Date: Oct. 18, 2012

(65) Prior Publication Data
US 2014/0037369 A1    Feb. 6, 2014

(30) Foreign Application Priority Data

Apr. 15, 2011  (JP) .................................. 2011-090900

(51) Int. Cl.
| B23K 35/26 | (2006.01) |
| C22C 13/00 | (2006.01) |
| H05K 3/34 | (2006.01) |

(52) U.S. Cl.
CPC ............... *B23K 35/262* (2013.01); *B23K 35/26* (2013.01); *C22C 13/00* (2013.01); *H05K 3/3463* (2013.01); *Y10T 403/479* (2015.01)

(58) Field of Classification Search
USPC ......................................................... 420/560
IPC ................................ B23K 35/262; C22C 13/00
See application file for complete search history.

(56) References Cited

U.S. PATENT DOCUMENTS

| 6,554,180 B1 | 4/2003 | Katoh et al. |
| 2004/0262779 A1 | 12/2004 | Amagai et al. |
| 2008/0159903 A1 | 7/2008 | Lewis et al. |
| 2010/0189594 A1 | 7/2010 | Fujiyoshi et al. |
| 2012/0038042 A1 | 2/2012 | Sasaki et al. |

FOREIGN PATENT DOCUMENTS

| CN | 1788918 A | 6/2006 |
| EP | 1245328 A1 | 10/2002 |
| EP | 2275224 A1 * | 1/2011 |
| JP | 2001-058286 A | 3/2001 |
| JP | 2001071173 A | 3/2001 |
| JP | 2002-018589 A | 1/2002 |
| JP | 2002-239780 A | 8/2002 |
| JP | 2004-261863 A | 9/2004 |
| JP | 2008-142721 A | 6/2008 |
| JP | 2009-226481 A | 10/2009 |
| JP | 2009226481 A * | 10/2009 |
| JP | 2010-247167 A | 11/2010 |
| WO | WO 2007/081006 A1 | 7/2007 |

* cited by examiner

*Primary Examiner* — Roy King
*Assistant Examiner* — Janelle Morillo
(74) *Attorney, Agent, or Firm* — Bret E. Field; Bozicevic, Field & Francis LLP

(57) ABSTRACT

The present invention provides a lead-free solder alloy having high reliability and excellent solder bonding properties and suited for the mounting of micronized electronic components at low cost. The lead-free solder alloy according to the present invention has a composition containing 0.5 to 1.5 wt % of Ag, 0.3 to 1.5 wt % of Cu, 0.01 to 0.2 wt % of Ni, 1.0 wt % or less of Ga, and the balance being Sn and unavoidable impurities.

3 Claims, 2 Drawing Sheets

LEAD-FREE SOLDER ALLOY

CROSS-REFERENCE TO RELATED APPLICATIONS

This application is the national phase under 35 U.S.C. §371 of PCT International Application No. PCT/JP2012/060299 which has an International filing date of Apr. 16, 2012 and designated the United States of America.

BACKGROUND

1. Field

The present invention relates to a lead-free solder, and more particularly, to a lead-free solder alloy suited for micro-solder bonding for use in electronic components and to solder bonding using the solder alloy.

2. Background Art

In recent years, the use of lead-free solders is widespread in consideration of global environment. For example, Sn—Cu, Sn—Cu—Ni, Sn—Ag, Sn—Ag—Cu, Sn—Zn, Sn—Ag—Bi, Sn—Sb, Sn—Bi, Sn—In, Al—Si and Bi—Zn lead-free solder alloys and lead-free solder alloys obtained by appropriately adding Ni, Co, Ge, Ga, Cr, P, Si, Ti, V, Mn, Fe, Zr, Nb, Mo, Pd, Te, Pt, Au, etc. to the above-mentioned lead-free solder alloys have been proposed and are put into practical use. Of the above-mentioned lead-free solder alloys, in particular, Sn—Cu, Sn—Ag—Cu and Sn—Cu—Ni eutectic solder alloys are used frequently.

On the other hand, as personal computers, mobile terminals, etc. are downsized, electronic components to be used in those electronic devices are miniaturized. Also in the mounting of such electronic components, there is a strong tendency to micronization. Furthermore, in the mode of mounting electronic components, BGA (ball grid array) and CSP (chip size package) technologies and solder paste containing fine lead-free solder alloy powder are being used Moreover, as a lead-free solder alloy suited for micronization in the mounting of electronic components, for example, a lead-free solder alloy having a composition containing 3.0 wt % of Ag, 0.5 wt % of Cu and the balance being Sn are put into practical use. However, since the solder alloy contains 3.0 wt % of Ag and is expensive, lead-free solder alloys being less expensive and having excellent bonding properties and high reliability are demanded, and various lead-free solder alloys are being developed and examined.

For example, Japanese Patent Application Laid-Open No. 2002-239780 exemplifies a lead-free solder alloy having a basic composition of Sn—Ag—Cu containing 1.0 to 2.0 wt % of Ag, 0.3 to 1.5 wt % of Cu and the balance being Sn, to which Sb, Zn, Ni and Fe are added appropriately, whereby the lead-free solder alloy is less expensive than the lead-free solder alloy containing 3.0 wt % of Ag and is superior in bonding reliability and drop impact resistance. However, the lead-free solder alloy has problems left unsolved in wettability and oxidation resistance at solder bonding portions, etc. in comparison with the conventional lead-free solder alloy having a composition containing 3.0 wt % of Ag, 0.5 wt % of Cu and the balance being Sn.

Furthermore, WO 2007/081006 exemplifies a lead-free solder alloy having a composition of Sn—Ag—Cu—Ni containing 0.1 to 1.5 wt % of Ag, 0.5 to 0.75 wt % of Cu, Ni satisfying the relationship of $12.5 \leq Cu/Ni \leq 100$, and the balance being Sn.

However, as in the case of Japanese Patent Application Laid-Open No. 2002-239780, the lead-free solder alloy also has problems left unsolved in wettability and oxidation resistance at solder bonding portions in comparison with the conventional lead-free solder alloy having a composition containing 3.0 wt % of Ag, 0.5 wt % of Cu and the balance being Sn.

Moreover, Japanese Patent Application Laid-Open No. 2001-58286 exemplifies a solder paste consisting of a lead-free solder alloy having a basic composition of Sn—Ag containing 0.2 to 1.0 wt % of Ag and the balance being Sn, to which 1.0 wt % or less in total of Cu and/or Sb, 0.3 wt % or less in total of one or two or more selected from the group consisting of Ni, Co, Fe, Mn, Cr and Mo, 0.5 or more to 3.0 wt % or less in total of one or two or more selected from the group consisting of Bi, In and Zn, and 0.2 wt % or less in total of one or two or more selected from the group consisting of P, Ga and Ge are respectively added. However, the mode according to the patent disclosed in Patent Document 3 is limited to a paste, and the use thereof is also limited to the prevention of chip rising. Hence, versatile lead-free solder alloys, other than solder pastes, having compositions applicable to BGA, for example, are demanded.

What's more, the inventors of the present invention has proposed a lead-free solder alloy having a composition of Sn—Cu—Ni—Ga containing 2 wt % or less of Cu, 0.002 to 0.2 wt % of Ni, 0.001 wt % or less of Ga and the balance being Sn as disclosed in Japanese Patent Application Laid-Open No. 2008-142721. However, lead-free solder alloys having higher properties in wettability and drop impact resistance are demanded.

SUMMARY

In view of the above-mentioned circumstances, the present invention is intended to provide a lead-free solder alloy having high reliability and excellent solder bonding properties, suited for downsized electronic devices spreading rapidly in recent years and suited for the mounting of micronized electronic components at low cost.

On the basis of a lead-free solder alloy having a basic composition of Sn—Cu—Ni, the inventors of the present invention examined the amounts of respective ingredients to be blended and ingredients to be added. As a result, the inventors found that by the addition of Ag and Ga, a lead-free solder alloy having a composition containing, as ingredients, 0.3 to 1.5 wt % of Cu, 0.01 to 0.2 wt % of Ni, 0.5 to 1.5 wt % of Ag, 1.0 wt % or less of Ga, and the balance being Sn and unavoidable impurities exhibited soldering properties excellent in mechanical properties, in particular, impact resistance, thereby completing the present invention.

Having a composition containing no lead, the lead-free solder alloy according to the present invention can provide environmentally-friendly solder bonding as a matter of course. Furthermore, being excellent in mechanical properties, such as impact resistance, the lead-free solder alloy has high reliability and is applicable to micronized solder bonding suited for the downsizing of mobile terminals, digital products, etc. spreading rapidly in recent years.

The above and further objects and features will more fully be apparent from the following detailed description with accompanying drawings.

DETAILED DESCRIPTION

Figure 1:
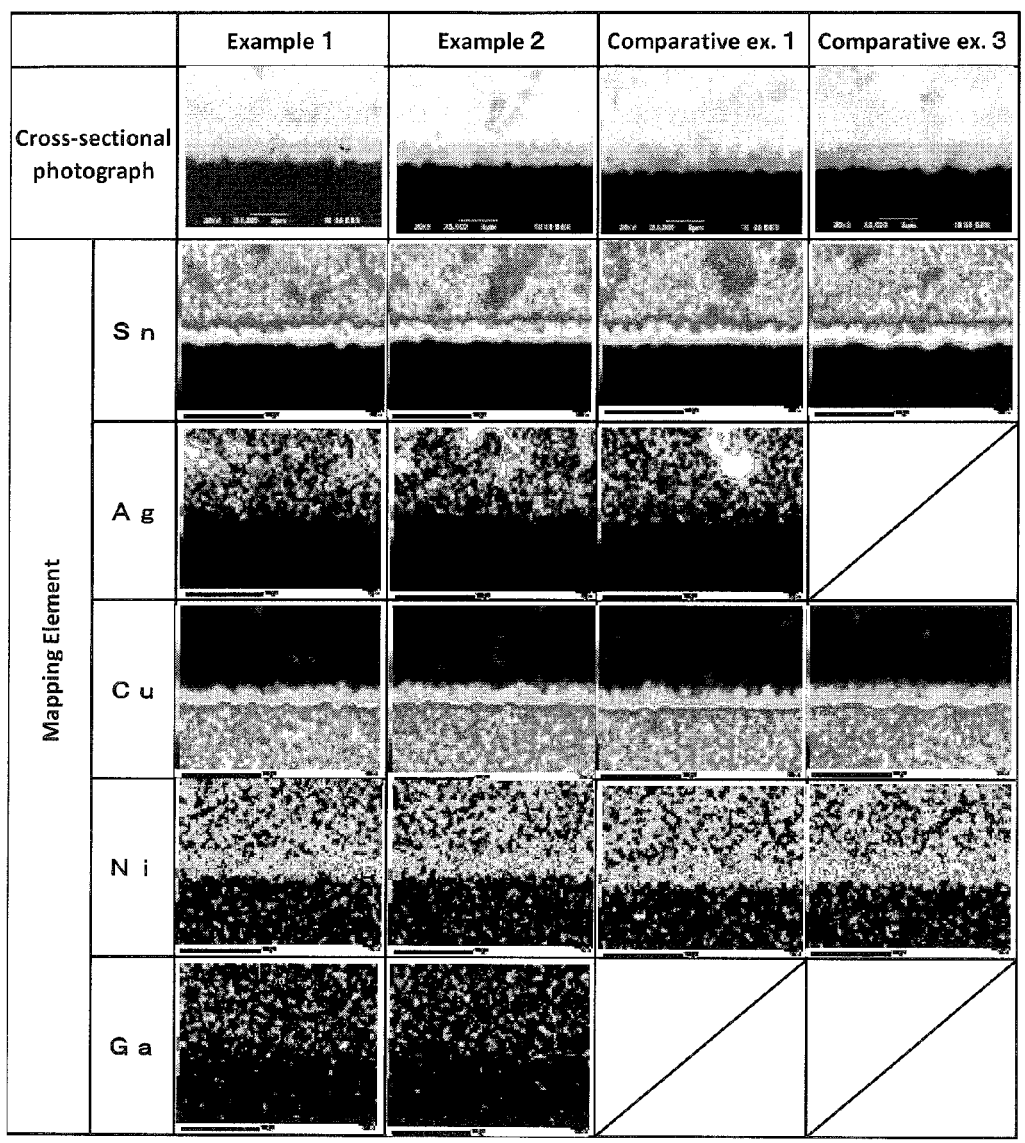
FIG. 1 is a diagram showing the observation results of the bonding cross-sections of samples in which soldering was performed on a Cu plate using lead-free solder alloys according to Examples of the present invention and Comparative Examples.

Solder materials according to the present invention will be described below in detail.

The lead-free solder alloy according to the present invention is based on a lead-free solder alloy having a basic composition of Sn—Cu—Ni, to which Ag and Ga are further added, thereby having a composition containing, as ingredients, 0.3 to 1.5 wt % of Cu, 0.01 to 0.2 wt % of Ni, 0.5 to 1.5 wt % of Ag, 1.0 wt % or less of Ga, and the balance being Sn and unavoidable impurities.

In other words, the lead-free solder alloy according to the present invention is obtained by adding a specific amount of Ag to a lead-free solder alloy having a basic composition containing Sn as a main ingredient and Cu and Ni added thereto, whereby the start of wetting an object to be bonded is hastened and the mechanical strength of the alloy itself at solder bonding portions is improved. In other words, the lead-free solder alloy is improved in wettability and mechanical strength.

However, in the case that solder bonding is performed using the solder alloy having a composition of Sn—Cu, Sn reacts with Cu, and intermetallic compounds, such as $Cu_6Sn_5$ or $Cu_3Sn$, are formed at the bonding interface with a copper plate. Although such intermetallic compounds are necessary for solder bonding to obtain mechanical strength, it is known that if intermetallic compounds are formed excessively, the bonding interface becomes brittle. To solve this problem, Ni forming a full solid solution with Cu is added, and in the case that an object to be bonded is a copper plate, Ni reacts with Cu near the bonding interface, and a nickel barrier layer is formed. The nickel barrier layer can suppress the formation and growth of the intermetallic compounds.

Furthermore, the effect of the addition of Ga produces an antioxidant effect and hastens diffusional wettability at the time of bonding while lowering the surface tension of the melted alloy, whereby it is known that the strength of the bonding is improved. Moreover, the effect of the addition produces an effect of suppressing abnormal formation of Sn—Cu intermetallic compounds near the bonding interface. In the case that an object to be soldered is a nickel plate, nickel barrier does not function. However, the addition of Ga contained in the composition of the lead-free solder alloy according to the present invention suppresses Ni diffusion and strengthens the bonding interface, thereby being capable of accomplishing solder bonding being excellent in bonding strength.

The lead-free solder alloy having a composition of Sn—Ag—Cu—Ni—Ga according to the present invention has actions for improving the mechanical strength of the solder alloy by the addition of Ag and for suppressing excessive formation of intermetallic compounds at the solder bonding interface by the addition of Ni and Ga. As a result, strong solder bonding improved in mechanical strength can be maintained for an extended period, thereby having high reliability.

The addition amount of Ag for use in the lead-free solder alloy according to the present invention is preferably 0.5 to 1.5 wt %, and in this range, mechanical strength, in particular, impact resistance, is improved. In addition, in the range of 1.0 to 1.2 wt %, the effect is further improved. However, in the case that the addition amount of Ag is less than 0.5 wt % or more than 1.5 wt %, adverse effects, such as insufficient mechanical strength, may occur.

Within the scope in which the advantageous effect of the present invention is obtained, the blending amount of Ga for use in the lead-free solder alloy according to the present invention is not limited particularly, but preferably 1.0 wt % or less and further preferably 0.0001 to 0.1 wt %. The addition of Ga produces an antioxidant effect and hastens diffusional wettability at the time of bonding while lowering the surface tension of the melted alloy, whereby it is known that the strength of the bonding is improved. However, in order that the suppression of abnormal formation of Sn—Cu intermetallic compounds near the bonding interface, that is, an advantageous effect of the present invention, is accomplished, the effective blending amount is 0.0001 to 0.1 wt %. Furthermore, the blending amount of 0.0001 to 0.03 wt % is particularly effective.

The blending amount of Ni for use in the lead-free solder alloy according to the present invention is preferably 0.01 to 0.2 wt % and further preferably 0.03 to 0.07 wt %. In the case that the addition amount of Ni is less than 0.01 wt % or more than 0.2 wt %, there may be problems such that intermetallic compounds are not formed sufficiently at the bonding interface and that the melting point of the solder alloy rises.

The addition amount of Cu for use in the lead-free solder alloy according to the present invention is preferably 0.3 to 1.5 wt % and further preferably 0.5 to 1.0 wt %. In the case that the addition amount of Cu is less than 0.3 wt % or more than 1.5 wt %, there may be problems such that the melting point of the solder alloy rises.

Within the scope in which the advantageous effect of the present invention is obtained, other ingredients may be added without problems to the composition of Sn—Ag—Cu—Ni—Ga of the lead-free solder alloy according to the present invention. For example, ingredients having an antioxidant effect, such as Ge and P, may be added.

Furthermore, within the scope in which the advantageous effect of the present invention is obtained, the lead-free solder alloy according to the present invention can be processed into any desired form, and used in any forms of BGA, fine powder, linear form and preform, and futher solder paste by mixing the powder with flux.

Moreover, various methods, such as dipping, reflow and solder bonding using a soldering iron, can be selected as desired as the method for using the solder alloy depending on the form of the solder alloy.

Examples

Next, the present invention will be described on the basis of the results of tests conducted by the inventors of the present invention.

Lead-free solder alloys having the compositions shown in Table 1 were prepared by the usual method and subjected to the tests. The values in Table 1 are in weight %.

TABLE 1

| | Composition (Weight %) | | | | | |
|---|---|---|---|---|---|---|
| | Sn | Cu | Ni | Ag | Ga | Ge |
| Example1 | The balance | 0.7 | 0.05 | 1.1 | 0.0050 | — |

TABLE 1-continued

| | Composition (Weight %) | | | | | |
|---|---|---|---|---|---|---|
| | Sn | Cu | Ni | Ag | Ga | Ge |
| Example2 | The balance | 0.7 | 0.05 | 1.1 | 0.0150 | — |
| Example3 | The balance | 0.7 | 0.05 | 1.1 | 0.0300 | — |
| Example4 | The balance | 0.7 | 0.05 | 1.1 | 0.0500 | — |
| Example5 | The balance | 0.7 | 0.05 | 1.1 | 0.1000 | — |
| Example6 | The balance | 0.5 | 0.03 | 1.0 | 0.0001 | — |
| Example7 | The balance | 1.0 | 0.07 | 1.2 | 1.0000 | — |
| Example8 | The balance | 0.3 | 0.01 | 0.8 | 0.0010 | — |
| Example9 | The balance | 1.5 | 0.20 | 1.5 | 1.0000 | — |
| Example10 | The balance | 0.7 | 0.05 | 0.5 | 0.0050 | — |
| Comparative ex. 1 | The balance | 0.7 | 0.05 | 1.1 | — | — |
| Comparative ex. 2 | The balance | 0.7 | — | 1.1 | 0.0050 | — |
| Comparative ex. 3 | The balance | 0.7 | 0.05 | — | — | 0.007 |
| Comparative ex. 4 | The balance | 0.2 | 0.05 | 1.1 | 0.0050 | — |
| Comparative ex. 5 | The balance | 0.7 | 0.05 | 1.7 | 0.0050 | — |
| Comparative ex. 6 | The balance | 0.7 | 0.05 | 0.3 | — | — |
| Comparative ex. 7 | The balance | 0.7 | 0.05 | 1.0 | — | — |

(Cross-Sectional Observation Test at Solder Bonding Portion)

The following will describe a method for preparing samples for a cross-sectional observation test at a solder bonding portion and the results of the cross-sectional observation.

First, samples for the cross-sectional observation test were prepared according to the following procedure.

1) The respective lead-free solder alloys of Examples 1 and 2 and Comparative Examples 1 and 3 were prepared and the solder alloys were weighed accurately (0.3 g).

2) In conformity with the requirements of the spreading test JIS Z3197, one drop of the standard flux B was put on an oxidized copper plate, and each solder alloy sample was placed on the plate.

3) The oxidized copper plate was placed on a hot plate at 250° C. Thirty seconds after it was confirmed that the solder alloy had been melted, the copper plate was transferred onto an iron block and cooled rapidly.

4) After the copper plate was cooled to room temperature, the flux was removed with IPA and the sample was dried.

5) In conformity with the requirements of the usual SEM observation method, the sample was embedded in epoxy resin and polished so that the cross-section thereof was mirror finished.

6) Also in the case that the object to be bonded is a nickel plate, samples were prepared by following a procedure similar to that described in the above-mentioned steps 1) to 5).

FIG. 1 shows the results of elemental mapping using scanning electron micrography and SEM-EDX for the respective samples of Examples 1 and 2 and Comparative Examples 1 and 3 in the case that a copper plate was used as an object to be bonded.

Figure 2:
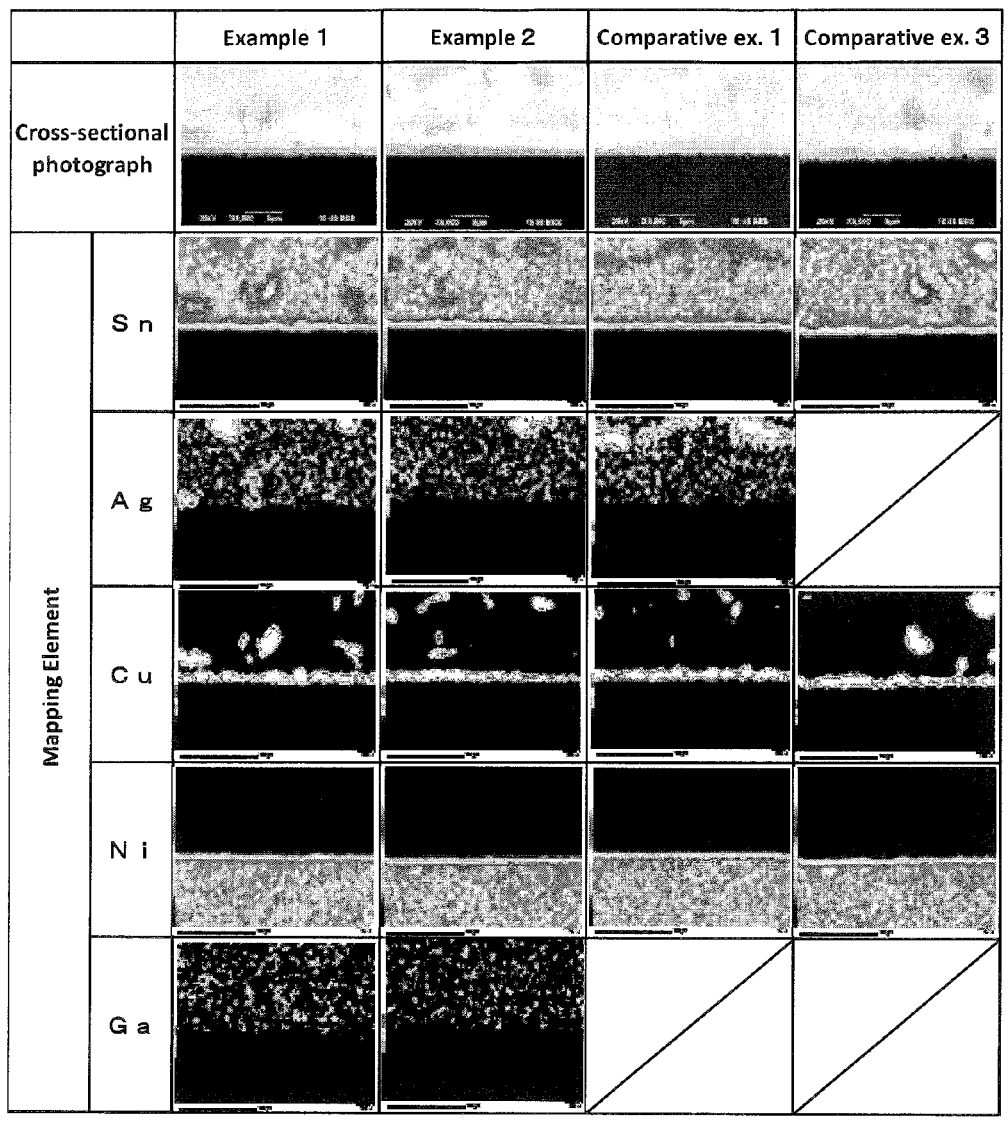
FIG. 2 is a diagram showing the observation results of the bonding cross-sections of samples in which soldering was performed on a Ni plate using the lead-free solder alloys according to Examples of the present invention and Comparative Examples.

Next, FIG. 2 shows the results of elemental mapping using scanning electron micrography and SEM-EDX for the respective samples of Examples 1 and 2 and Comparative Examples 1 and 3 in the case that a nickel plate was used as an object to be bonded.

According to the cross-sectional photographs of FIGS. 1 and 2, it is found that uniform and fine intermetallic compounds have been formed at the bonding interfaces of the Sn—Ag—Cu—Ni—Ga solder alloys of Examples 1 and 2 according to the present invention in comparison with the solder alloys of Comparative Examples 1 and 3 not containing Ga.

In addition, according to the elemental mapping of FIG. 1, it is found that Ni has been concentrated at the bonding interfaces on the copper and nickel plates of Example 1. This proves that in the case that solder bonding was performed using the lead-free solder alloy according to the present invention and that the object to be bonded is a Cu plate, a nickel barrier layer has been formed near the bonding interface.

Furthermore, according to the cross-sectional photographs of FIG. 2, uniform intermetallic compounds have been formed at the bonding interfaces of the solder alloys of Examples 1 and 2 in comparison with the solder alloys of Comparative Examples 1 and 3, and according to the elemental mapping of FIG. 2, Ni has been concentrated at the bonding interfaces. For these reasons, it is assumed that the barrier effect by Ga has been activated and that excessive elution of nickel has been suppressed.

What's more, the data of the elemental mapping of FIGS. 1 and 2 are coincident with the results of the impact strength test described later. Hence, in the Sn—Ag—Cu—Ni—Ga solder alloy according to the present invention, in addition to the improvement in mechanical strength of the solder alloy, not only the bonding strength is improved but also the strong solder bonding can be maintained for an extended period due to the uniform and fine intermetallic compounds formed on the bonding interface. As a result, it is assumed that high reliability is maintained.

With respect to the mechanical strength at the solder bonding portion, the method of the impact strength test and the results of the test will be described below.

(impact Strength Test Method)

The impact strength test conducted using the respective solder alloy compositions of Examples 1 to 10 and Comparative Examples 1 to 7 will be described below.

[Preparation of Samples]

1) Solder alloys having the compositions of Examples 1 to 10 and Comparative Examples 1 to 7 were processed into foils having a thickness of appropriately 0.4 mm.

2) The solder foils were cut to appropriately 0.5 mm both in height and width, whereby solder cubes with a square of 0.5 mm and a height of 0.4 mm (cubes measuring appropriately 0.5×0.5×0.4 mm) were prepared.

3) An appropriate amount of flux was applied to a substrate plated with Ni and Au (non-electrolytic Ni/Au plating: Ni 3 μm, Au 0.03 μm), and then the cubes prepared at step 2) were mounted by reflow soldering under the following conditions, whereby samples to be used for the impact strength test were prepared.

Reflow conditions: main heating time 40 sec/220° C., peak temperature 240° C.

[Test Method]

The impact strength test was conducted under the following conditions, and the results of the test are shown in Table 2.

1) Impact strength tester: Impact Tester DAGE 4000HS manufactured by Dage Corporation 2) Test conditions
Pull test: speed 100, 200 (mm/sec)
Shear test: speed 1000, 2000 (mm/sec)

Table 2 shows the results of the impact strength test conducted using respective solder alloy compositions of Examples 1 to 10 and Comparative Examples 1 to 7.

TABLE 2

| | Pull | | Shear | |
|---|---|---|---|---|
| | Speed100 (mm/sec) | Speed200 (mm/sec) | Speed1000 (mm/sec) | Speed2000 (mm/sec) |
| Example1 | 0.487 | 0.511 | 2.702 | 2.174 |
| Example2 | 0.305 | 0.496 | 1.999 | 1.298 |
| Example3 | 0.303 | 0.328 | 1.157 | 1.260 |
| Example4 | 0.210 | 0.311 | 1.001 | 1.073 |
| Example5 | 0.209 | 0.282 | 1.603 | 1.170 |
| Example6 | 0.401 | 0.477 | 2.325 | 1.106 |
| Example7 | 0.378 | 0.641 | 2.186 | 1.432 |
| Example8 | 0.399 | 0.528 | 1.922 | 1.254 |
| Example9 | 0.149 | 0.202 | 1.354 | 1.301 |
| Example10 | 0.314 | 0.416 | 2.052 | 1.413 |
| Comparative ex. 1 | 0.128 | 0.185 | 0.436 | 0.709 |
| Comparative ex. 2 | 0.219 | 0.223 | 0.398 | 0.487 |
| Comparative ex. 3 | 0.210 | 0.230 | 0.437 | 0.702 |
| Comparative ex. 4 | 0.352 | 0.353 | 0.624 | 0.485 |
| Comparative ex. 5 | 0.166 | 0.192 | 1.928 | 0.498 |
| Comparative ex. 6 | 0.520 | 0.320 | 1.437 | 0.306 |
| Comparative ex. 7 | 0.352 | 0.353 | 1.921 | 0.510 |

According to Table 2, in comparison between Examples 1 to 5 in which Ga is added and Comparative Example 1 in which equal amounts of Cu, Ni and Ag are contained and Ga is not added, the results of the pull test are 0.2 or more and the results of the shear test are 1.0 or more in Examples 1 to 5; on the other hand, the results of the pull test are 0.2 or less and the results of the shear test are 1.0 or less in Comparative Example 1, whereby Table 2 indicates that Examples are superior to Comparative Example 1 in mechanical strength.

Furthermore, Examples 1 to 6 in which 0.0001 to 0.1 wt % of Ga is added are highly effective in the results of both the pull test and the shear test, in particular, Examples 1 to 3 and Example 6 are very highly effective in all the four conditions, that is, the two conditions in the pull test and the two conditions in the shear test. This proves that a more effective addition amount of Ga is 0.0001 to 0.03 wt %.

Moreover, according to Table 2, the results (at speed: 200 mm/sec) of the pull test are 0.2 or more and the results (in both the two conditions) of the shear test are 1.0 or more in Examples 6 to 10 in which the upper limit amount and lower limit amount of the respective ingredients of the solder alloy according to the present invention are added. It is thus found that Examples 6 to 10 are highly effective in the results of both the pull test and the shear test in comparison with Comparative Examples 1 to 7.

As described above, in the Sn—Ag—Cu—Ni—Ga solder alloy according to the present invention, in addition to the improvement in the effect of mechanical strength, the strong solder bonding can be maintained for an extended period due to the uniform and fine intermetallic compounds formed on the bonding interface, whereby it is assumed that high reliability can be maintained. Consequently, solder bonding and solder joints suited for the mounting of micronized electronic components of miniaturized electronic devices and the like can be accomplished.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims

The invention claimed is:

1. A lead-free solder alloy consisting of:
 1.0 to 1.2 wt % of Ag;
 0.3 to 1.5 wt % of Cu;
 0.035 to 0.2 wt % of Ni;
 0.0015 to 0.005 or 0.05 to 0.1 wt % of Ga; and
 the balance being Sn and impurities.

2. A lead-free solder alloy consisting of:
 1.0 to 1.2 wt % of Ag;
 0.3 to 1.5 wt % of Cu;
 0.035 to 0.2 wt % of Ni;
 0.0015 to 0.005 wt % of Ga; and
 the balance being Sn and impurities.

3. A lead-free solder alloy consisting of:
 1.0 to 1.2 wt % of Ag;
 0.3 to 1.5 wt % of Cu;
 0.035 to 0.2 wt % of Ni;
 0.05 to 0.1 wt % of Ga; and
 the balance being Sn and impurities.

* * * * *